US012171081B2

(12) United States Patent
Marcade et al.

(10) Patent No.: US 12,171,081 B2
(45) **Date of Patent: *Dec. 17, 2024**

(54) CROSSBAR AND SLED FOR A MODULAR SERVER AND/OR INFORMATION HANDLING SYSTEM

(71) Applicant: ZT Group Int'l, Inc., Secaucus, NJ (US)

(72) Inventors: Michael Dennis Marcade, Pflugerville, TX (US); Ellie Elsu, Austin, TX (US); Mark Hammond, Round Rock, TX (US); Vladimir Igor Lipnevici, Austin, TX (US); Bradley Andrew Jackson, Pflugerville, TX (US)

(73) Assignee: ZT Group Int'l, Inc., Secaucus, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/414,954

(22) Filed: Jan. 17, 2024

(65) Prior Publication Data

US 2024/0179867 A1 May 30, 2024

Related U.S. Application Data

(63) Continuation of application No. 17/708,173, filed on Mar. 30, 2022, now Pat. No. 11,910,560.

(51) Int. Cl.

| | |
|---|---|
| ***H05K 7/20*** | (2006.01) |
| ***H05K 7/14*** | (2006.01) |

(52) U.S. Cl.

CPC ....... *H05K 7/20145* (2013.01); *H05K 7/1489* (2013.01); *H05K 7/20172* (2013.01); *H05K 7/20727* (2013.01)

(58) Field of Classification Search

CPC ............. H05K 7/20145; H05K 7/1489; H05K 7/20172; H05K 7/20727; H05K 7/1487

See application file for complete search history.

(56) References Cited

U.S. PATENT DOCUMENTS

| | | | | |
|---|---|---|---|---|
| 6,466,448 | B1 * | 10/2002 | Baik | G06F 1/183 361/752 |
| 11,910,560 | B2 * | 2/2024 | Marcade | H05K 7/20172 |
| 2008/0101011 | A1 | 5/2008 | Carr et al. | |
| 2013/0100600 | A1 | 4/2013 | Yin et al. | |
| 2014/0036433 | A1 | 2/2014 | Guan | |
| 2016/0143178 | A1 | 5/2016 | Wang et al. | |
| 2016/0227668 | A1 | 8/2016 | Wang et al. | |
| 2016/0227669 | A1 | 8/2016 | Kwon et al. | |
| 2016/0381825 | A1 * | 12/2016 | Ehlen | H05K 7/1487 361/679.31 |

(Continued)

*Primary Examiner* — Stephen S Sul

(74) *Attorney, Agent, or Firm* — POLSINELLI PC

(57) ABSTRACT

A crossbar is provided that is operable to be removably installed in a sled for a modular server and/or information handling system, for example a network equipment building system. The crossbar includes a frame, a keystone portion of the frame forming a keystone air duct, and a riser guide extending from the frame. The keystone portion is operable to direct air flow through the keystone air duct towards a heat sink and/or a CPU. The riser guide is operable to align a riser to be plugged into a motherboard installed in the sled. The frame is operable to be a structural component that is substantially coupled to the sled chassis.

20 Claims, 8 Drawing Sheets

(56) References Cited

U.S. PATENT DOCUMENTS

2019/0250680 A1 8/2019 Lu et al.
2020/0084911 A1 3/2020 Mitsui
2021/0410335 A1* 12/2021 Tsorng .................... G06F 1/185
2022/0075431 A1* 3/2022 Tzeng ..................... G06F 1/186

* cited by examiner

CROSSBAR AND SLED FOR A MODULAR SERVER AND/OR INFORMATION HANDLING SYSTEM

CROSS REFERENCE TO RELATED APPLICATION

This application is a continuation of U.S. patent application Ser. No. 17/708,173, entitled "CROSSBAR AND SLED FOR A MODULAR SERVER AND/OR INFORMATION HANDLING SYSTEM," filed on Mar. 30, 2022, which is incorporated herein in its entirety.

FIELD

The present disclosure relates generally to a crossbar operable to be installed in a sled for a modular server and/or information handling system.

BACKGROUND

Modular servers and/or information handling systems, for example 5G equipment or servers, can be deployed in rugged environments. For example, Network Equipment Building System (NEBS) standards contain industry requirements for reliable electronics in telecommunication applications able to withstand extreme temperatures and environments for electronic systems. In some scenarios, NEBS systems may operate in environments having temperatures ranging from −5 degrees Celsius to 55 degrees Celsius at an elevation of 6000 feet. The NEBS may also operate 24 hours per day, seven days each week. Accordingly, the NEBS must withstand shock and vibration as well as high temperatures.

BRIEF DESCRIPTION OF THE DRAWINGS

Implementations of the present technology will now be described, by way of example only, with reference to the attached figures, wherein.

DETAILED DESCRIPTION

Figure 1A:
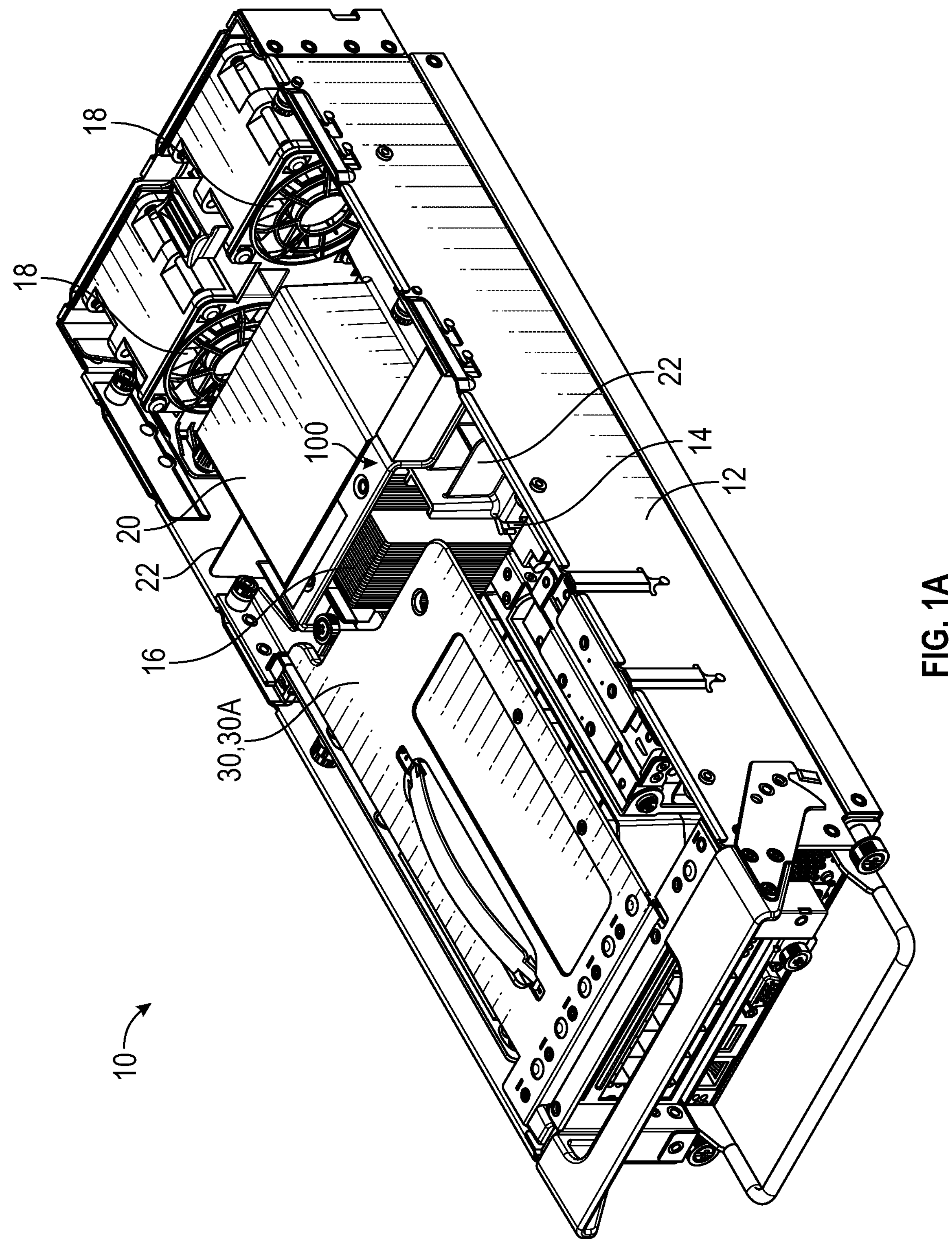
FIG. 1A is a perspective view of a sled used in a modular server and/or information handling system with a half-length riser installed.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented. The term "coupled" is defined as connected, whether directly or indirectly through intervening components, and is not necessarily limited to physical connections. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "about" means reasonably close to the particular value. For example, about does not require the exact measurement specified and can be reasonably close. As used herein, the word "about" can include the exact number. The term "near" as used herein is within a short distance from the particular mentioned object. The term "near" can include abutting as well as relatively small distance beyond abutting. The terms "comprising," "including" and "having" are used interchangeably in this disclosure. The terms "comprising," "including" and "having" mean to include, but not necessarily be limited to the things so described.

Disclosed herein is a crossbar operable to be installed into a sled, for example, to be used in a network equipment building system. The crossbar is operable to be installed into the sled such that both a half-length riser or a full-length riser, for example a half-length or a full-length PCIe riser, can be installed in the sled. Accordingly, the sled is operable to accommodate either a full-length riser or a half-length riser interchangeably. The crossbar is operable to provide structural support to the chassis of the sled through shock and/or vibration. In addition to the structural support, the crossbar is able to mitigate many challenges experienced by modular servers and/or information handling systems, for example network equipment building systems, such as high temperatures and space constraints. The crossbar can include a keystone portion operable to direct air flow through a keystone air duct to control air flow and cool the sled. For example, the crossbar can cause air to flow across a heat sink and/or a central processing unit (CPU). In at least one example, to assist in directing air flow, the crossbar can include an air dam operable to prevent air from passing therethrough. The crossbar can also include a riser guide operable to align and position a riser as the riser is plugged into a motherboard installed in the sled. The riser guide can prevent damage to the riser and/or the motherboard. The multipurpose crossbar can serve many functions within the sled, for example the functions can include a plurality of: support different lengths of riser configurations, support riser and guide in plugging, connect walls of the sled to provide chassis stiffness, provide a keystone main air duct, direct air flow with an air dam, cable routing and management, and/or offer fast service times.

Figure 1B:
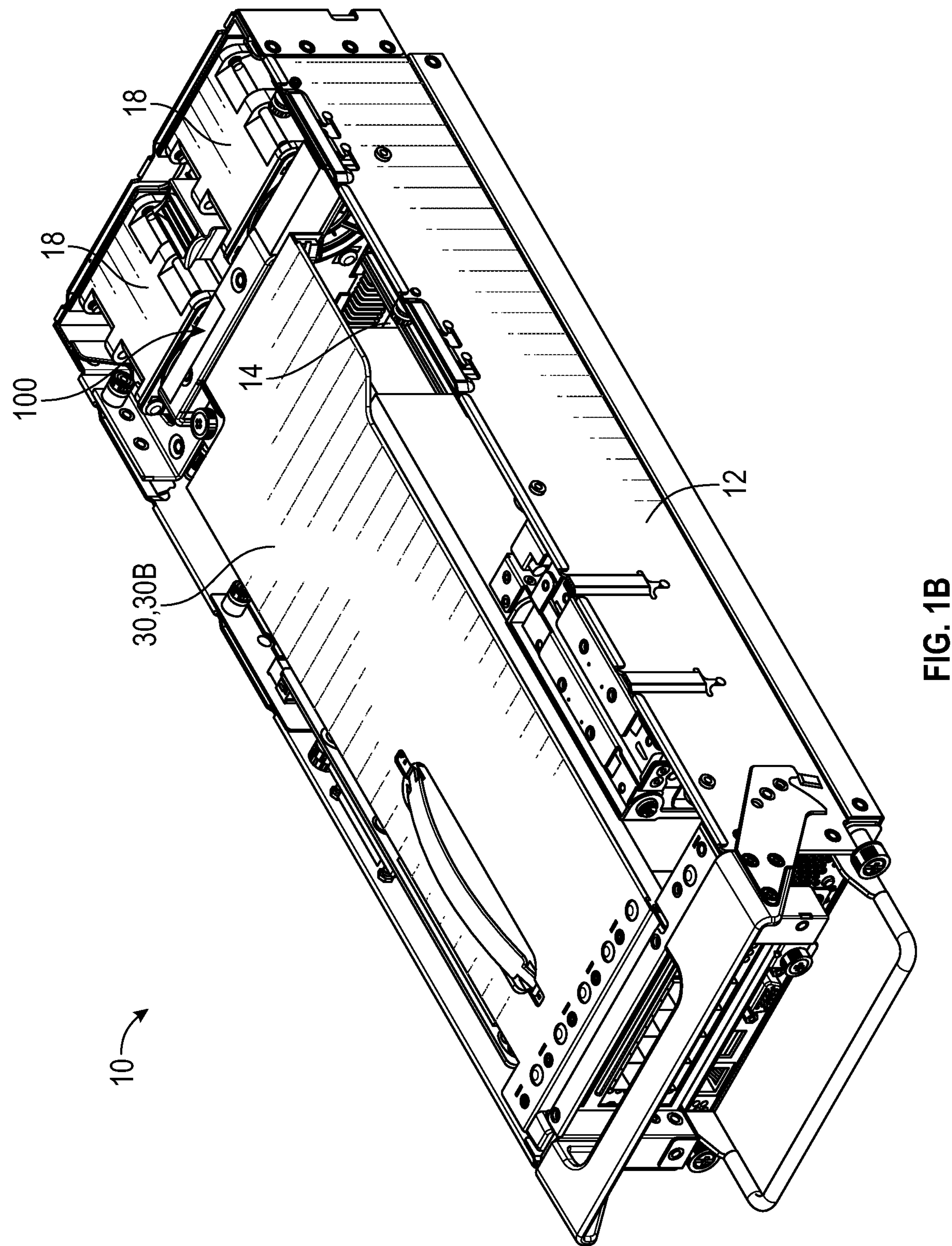
FIG. 1B is a perspective view of the sled with a full-length riser installed.

The disclosure now turns to FIGS. 1A and 1B, which illustrate examples of a sled 10 to be used in a modular server and/or information handling system, for example a network equipment building system (NEBS). The sled 10 can include a chassis 12 which is operable to receive a board 14 such as a motherboard, a central processing unit (CPU) 15 (shown in FIG. 3C), a heat sink 16, and one or more risers 30. In at least one example, the CPU 15 can be installed onto the board 14, and the heat sink 16 can be installed over the CPU 15. The heat sink 16 is operable to transfer heat generated by CPU 15 away from the CPU 15 and board 14, thereby allowing regulation of the system's temperature.

One or more fans 18 can be installed in the chassis 12. As illustrated in FIGS. 1A and 1B, two fans 18 are installed. In other examples, one, three, or more than three fans 18 can be installed into the chassis 12 without deviating from the scope of the present disclosure. The fans 18 can be operable to create air flow from within the chassis 12 to outside of the chassis 12. In at least one example, the fans 18 can be installed opposite the riser 30 in relation to the CPU 15 and the heat sink 16.

In at least one example, as illustrated in FIGS. 1A and 1B, the sled 10 can include a air duct 20 and one or more baffles 22. The air duct 20 is operable to cover at least a portion of the CPU 15 and the heat sink 16. For example, the air duct 20 may cover only the top of the heat sink 16. In some examples, as shown in FIGS. 1A and 1B, the air duct 20 may cover both the top and the sides of the heat sink 16. While the air duct 20 covers the heat sink 16 and CPU 15, the cover permits air flow across the heat sink 16 to the fans 18. The baffles 22, as will be discussed further in detail below, can be operable to control the air flow within the sled 10.

The riser 30 can be operable to receive one or more peripheral controller cards (not shown). The controller cards can be plugged into the riser 30 such that the controller cards sit parallel with the board 14. Accordingly, the riser 30 allows for additional controller cards to be connected with the board 14 while better utilizing the limited space within the chassis 12 of the sled 10. While the term riser 30 is utilized throughout the disclosure, the term riser cage and/or riser system can be interchanged without deviating from the scope of the disclosure.

As illustrated in FIG. 1A, the riser 30 can be a half-length riser 30A. The half-length riser 30A. As illustrated in FIG. 1B, the riser 30 can be a full-length riser 30B. The sled 10 is configured such that either a half-length riser 30A or a full-length riser 30B can be installed interchangeably without the need to change the board 14 or the structure of the chassis 12.

A crossbar 100 can be installed into the sled 10. In at least one example, the crossbar 100 is operable to be removably installed into the sled 10 and coupled with the chassis 12. For example, the crossbar 100 can be coupled with the chassis 12 after the board 14, CPU 15, and heat sink 16 are installed. If a component such as the heat sink 16, CPU 15, and/or board 14 needs to be removed, the crossbar 100 can be removed from the chassis 12. The crossbar 100 spans the sides of the chassis 12 so that the crossbar 100 improves the structural integrity of the sled 10. As the sled 10 receives forces such as shocks or vibrations, the crossbar 100 is operable to at least reduce and/or prevent collapse of the chassis 12. The shape of the chassis 12 can be better maintained so that the components installed within the chassis 12 are not damaged, and the desired air flow can be maintained.

In at least one example, as illustrated in FIGS. 1A and 1B, the crossbar 100 can be installed in the sled 10 between the fans 18 and the riser 30. As illustrated in FIG. 1B, the crossbar 100 can be installed with the riser 30 on one side and the CPU 15, heat sink 16, and fans 18 on the other side.

Figure 2A:
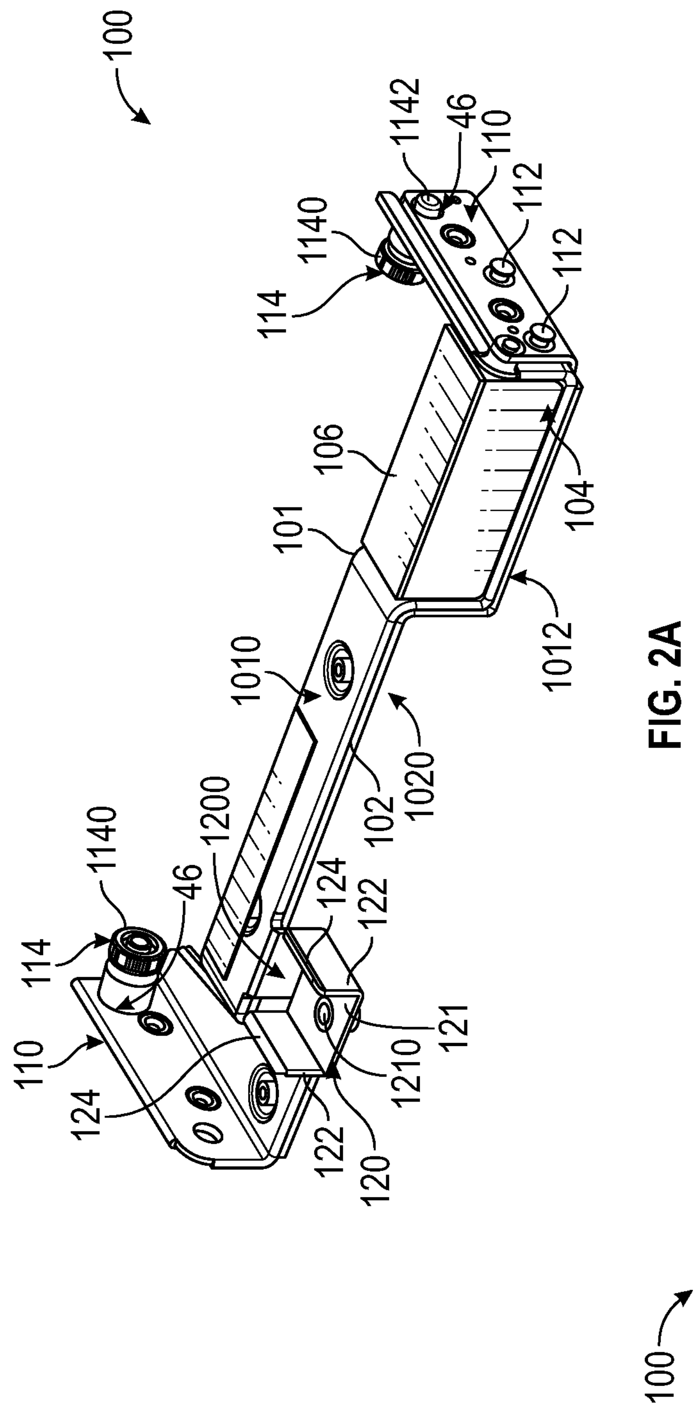
FIG. 2A is a perspective view of a crossbar.
Figure 2B:
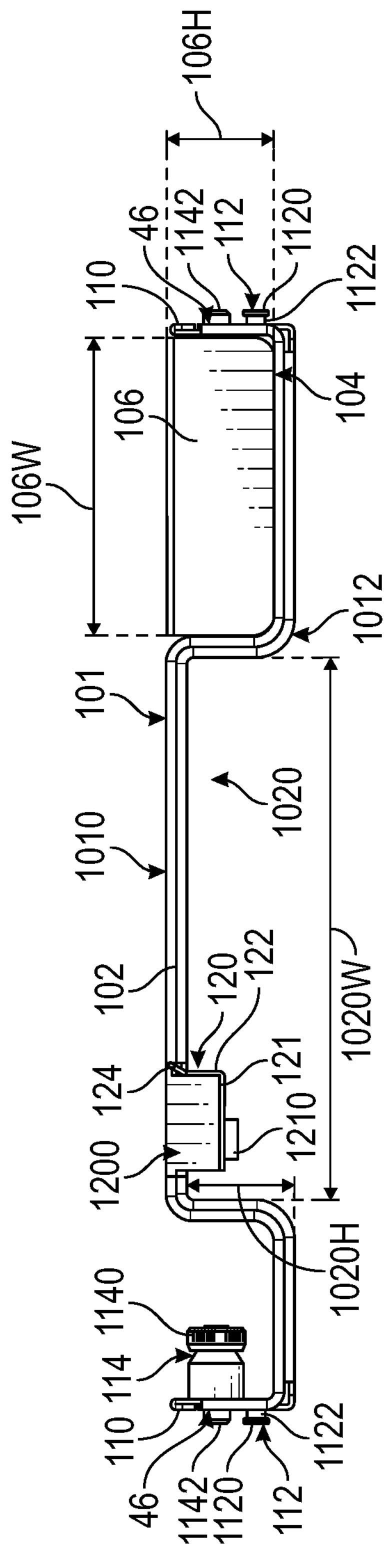
FIG. 2B is a front view of the crossbar of FIG. 2B.

FIGS. 2A and 2B illustrate the crossbar 100 in more detail. The crossbar 100 includes a frame 101 operable to provide structural support to the crossbar 100 as well as the chassis 12 of the sled 10. The frame 101 forms a top surface 1010 and a bottom surface 1012 opposite the top surface 1010. The frame 101 includes two lateral sides 110 operable to abut against and be coupled with corresponding sides of the chassis 12 of the sled 10. Each of the two lateral sides 110 includes at least one pin 112 and a fastener 114. The at least one pin 112 and the fastener 114 are operable to couple the frame 101 to the sled 10 to make up a structural component of the system. Accordingly, the crossbar 100, when coupled with the sled 10, provides structural support to the sled 10. As illustrated in FIGS. 2A and 2B, each of the two lateral sides 110 of the frame 101 includes two pins 112. In at least one example, the pins 112 can be T-pins, having a body 1122 extending from the lateral side 110 and a head extending from and/or coupled to the body 1122. For example, the head 1120 can be larger in diameter than a body 1122. In some examples, the head 1120 can extend outwardly in at least one direction perpendicular to the body 1122. The fastener 114 can have a head 1140 and a shaft 1142. As illustrated in FIGS. 2A and 2B, the head 1140 can be disposed on the inner side of the lateral side 110 while at least a portion of the shaft 1142 can extend through the lateral side 110 and be exposed on the external ide of the lateral side 110. In at least one example, the fastener 114 can include a plunger. In some examples, the fastener 114 can include thumbscrews, screws, pins, and/or any other suitable mechanism without deviating from the scope of the disclosure. In at least one example, the fastener 114 can be spring loaded. For example, when the shaft 1142 is pushed towards and/or into the lateral side 110 (e.g., in the direction of the head 1140), when the force is removed, the shaft 1142 springs back into position to extend from the lateral side 110. Similarly, if the head 1140 is pulled towards the center of the crossbar 100 so that the shaft 1142 is moved in the same direction, when the force is removed, the head 1140 springs back into position towards the lateral side 110. The shaft 1142 also returns to its original position and extends from the lateral side 110.

As discussed above, the crossbar 100 is operable to provide structural support to the sled 10 by acting as a stiffening device for the chassis 12. However, the crossbar 100 as disclosed herein, can be configured to provide a plurality of functions to mitigate many of the challenges for modular servers and/or information handling systems such as NEBS while working within the space constraints of the sled 10. For example, as will be discussed in further detail below, in addition to structural support, the crossbar 100 can support different lengths of risers 30, support and guide plugging of the riser 30, direct air flow within the sled 10, assist in cable routing and management, and/or offer fast service times by being easily removable and installable. Conventionally, these problems can be solved individually with numerous different components. However, the crossbar 100 as disclosed herein provides a single package which can address a plurality of these problems as one compact and moveable unit.

The crossbar 100 includes a keystone portion 102. The keystone portion 102 of the frame 101 is operable to form a keystone air duct 1020. The keystone air duct 1020 includes a cavity formed into the bottom surface 1012 of the frame 101. The keystone portion 102 is operable to permit air flow through the keystone air duct 1020 and assist in directing air flow within the sled 10. In at least one example, the keystone portion 102 and corresponding keystone air duct 1020 can have a width 1020W between about 6 centimeters and about 11 centimeters. Alternately, the width 1020W of the keystone air duct 1020 can be between about 7.5 centimeters and about 9.5 centimeters, alternately between about 8 centimeters and about 9 centimeters, alternately about 8.43 centimeters. The keystone air duct 1020 can have a height 1020H between about 0.5 centimeters and about 2 centimeters, alternately between about 0.8 centimeters and about 1.7 centimeters, alternately between about 1 centimeter and about 1.2 centimeters, alternately about 1.09 centimeters. The size and/or shape of the keystone portion 102 and keystone air duct 1020 can vary depending on the desired air flow within the sled 10.

In at least one example, the crossbar 100 can also include an air dam 106 adjacent to the keystone portion 102 and keystone air duct 1020. The air dam 106 can be operable to prevent air from passing therethrough to assist in directing the air flow in the sled 10, for example through the keystone air duct 1020. In at least one example, the air dam 106 can include a foam with a density sufficient to prevent air from passing therethrough. The air dam 106 can include other materials without deviating from the scope of the disclosure so long as the air dam can at least reduce and/or prevent air from flowing therethrough. The air dam 106 can be disposed in a dam cavity 104 formed in the frame 101. The dam cavity 104 can be formed into the top surface 1010 of the frame 101. Accordingly, the top surface 1010 of the keystone portion 102 of the frame 101 is offset from the top surface 1010 of the dam cavity 104. In at least one example, the air dam 106 can have a width 106W between about 2 centimeters and about 7 centimeters, alternately between about 3.5 centimeters and about 5.5 centimeters, alternately between about 4 centimeters and about 5 centimeters, alternately about 4.68 centimeters. The air dam 106 can have a height 106H between about 1 centimeter and about 3 centimeters, alternately between about 1.2 centimeters and about 2 centimeters, alternately about 1.65 centimeters. In at least one example, the height 106H of the air dam 106 can be sufficient to seal the top of the chassis 12 so that air cannot undesirably pass over the air dam 106 and/or crossbar 100. The size and/or shape of the air dam 106 can be adjusted so long as it is sufficient to block air flow across the crossbar 100 so that the air is directed to pass through the keystone air duct 1020. While the disclosure only includes one air dam 106 on the crossbar 100, in other examples, a plurality of air dams 106 can be integrated into the crossbar 100 as needed.

In at least one example, the crossbar 100 can include a riser guide 120 extending from the frame 101. For example, as illustrated in FIGS. 2A and 2B, the riser guide 120 can extend from a portion of the keystone portion 102 of the frame 101. The riser guide 120 is operable to align a riser 30 to be plugged into the board 14 installed in the sled 10. The riser guide 120 can include a floor 121 and at least one guide side 122 extending at an angle in relation to the floor 121 which together forms a receiving portion 1200. The receiving portion 1200 can be operable to receive a portion of the riser 30 to help align and also provide structural support to the riser 30 when plugged into the board 14. In some examples, the riser guide 120 includes a plurality of guide sides 122, as illustrated in FIG. 2A which includes two guide sides 122. In some examples, as illustrated in FIG. 2B, the riser guide 120 can include only one guide side 122. In at least one example, the guide side 122 can be substantially perpendicular to the floor 121. In some examples, the guide side 122 can be at an angle to the floor 121 to guide the riser 30 into the receiving portion 1200. In some examples, at least one of the guide sides 122 can have a guide portion 124 which is provided at an angle to the guide side 122. For example, as illustrated in FIGS. 2A and 2B, the guide side 122 is substantially perpendicular to the floor 121. The guide portion 124 is at an angle to the guide side 122 to provide a larger opening to insert the portion of the riser 30 while guiding the riser 30 into the receiving portion 1200. In at least one example, the riser guide 120 can include a coupling component 1210 operable to couple with the riser 30. In some examples, as illustrated in FIGS. 2A and 2B, the coupling component 1210 can be included on and/or coupled with the floor 121.

Figure 2C:
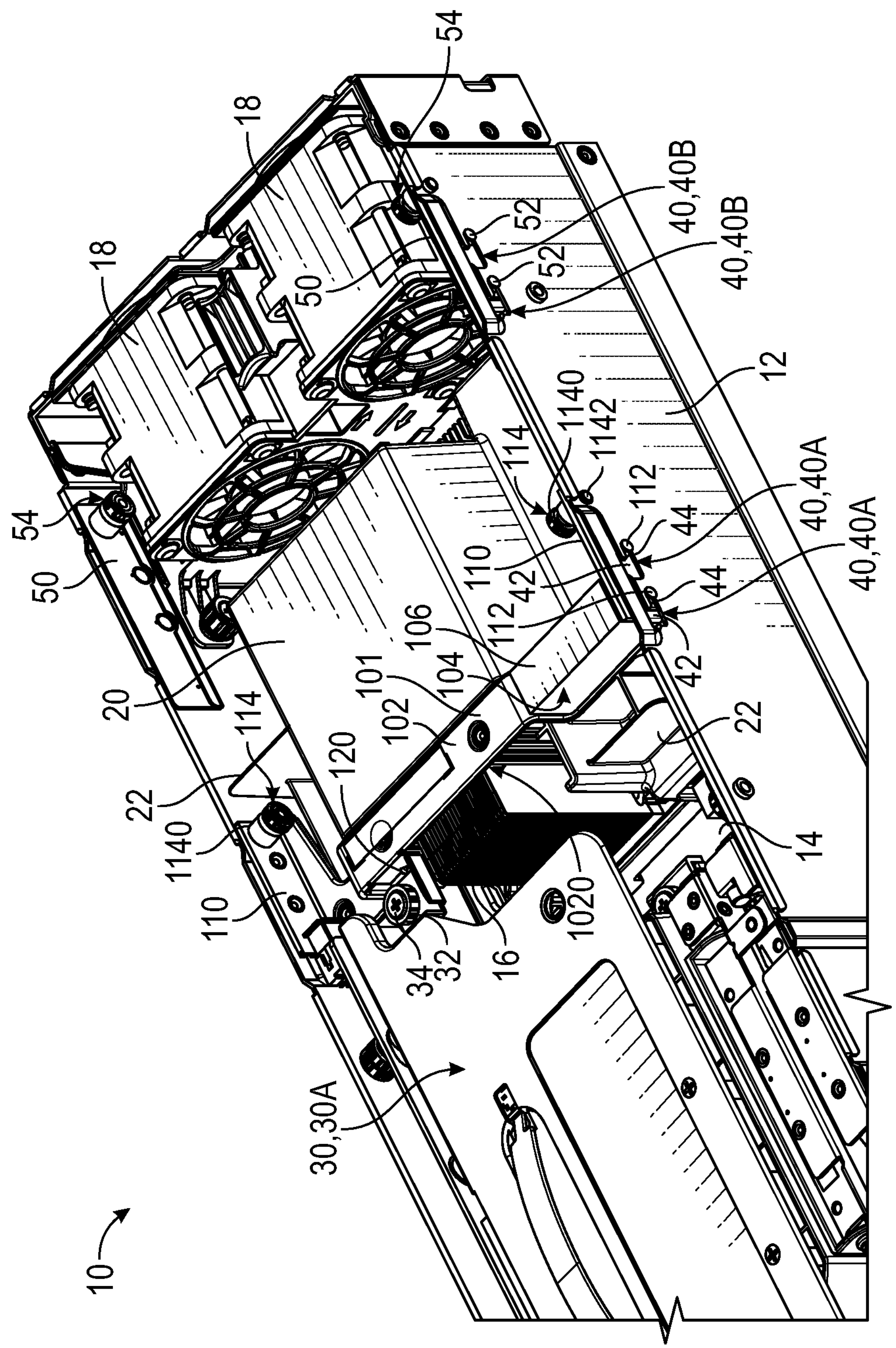
FIG. 2C is an enlarged view of a portion of the sled of FIG. 1A with the crossbar installed.
Figure 2D:
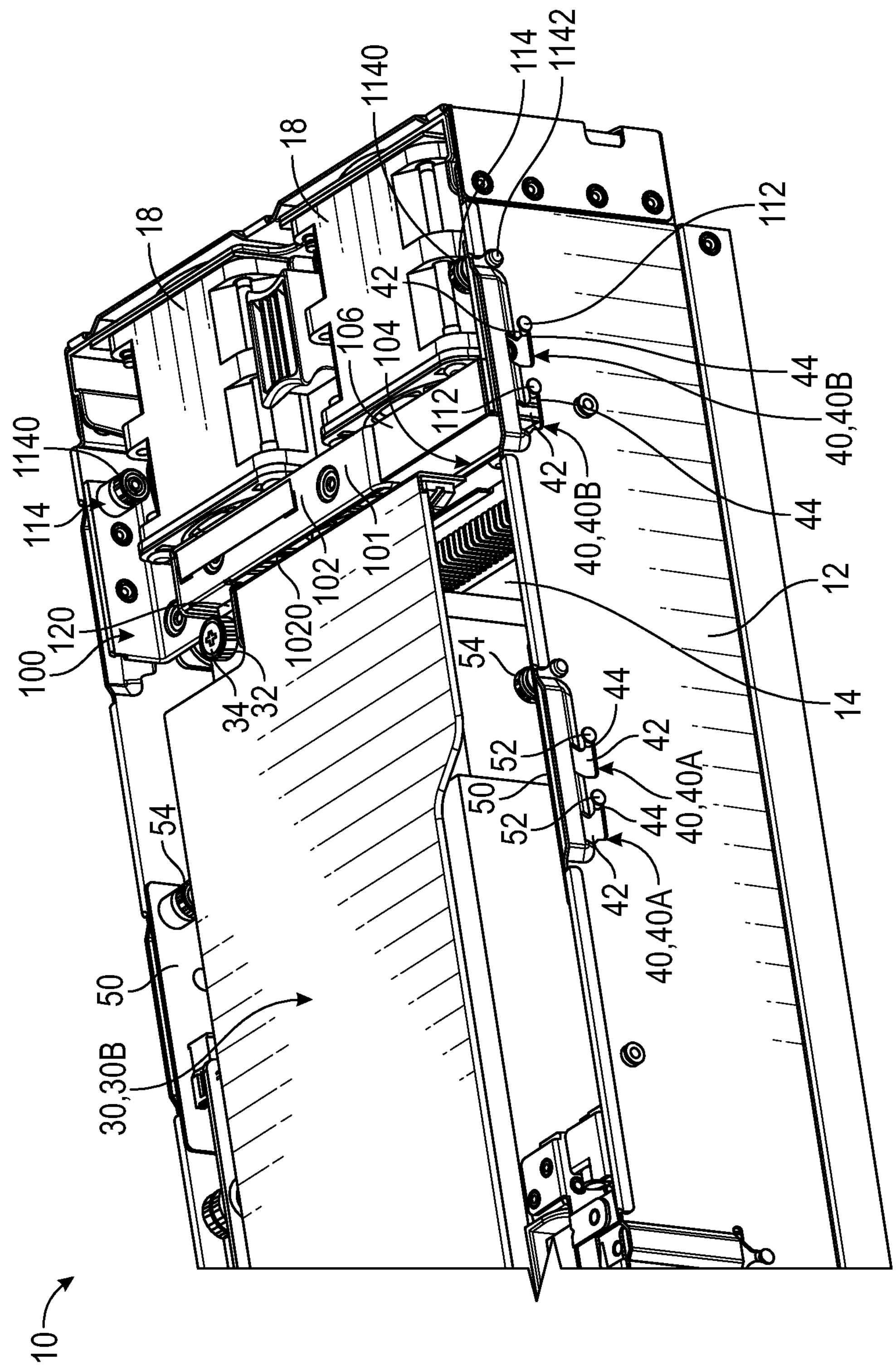
FIG. 2D is an enlarged view of a portion of the sled of FIG. 1B with the crossbar installed.

As shown in FIGS. 2C and 2D, the crossbar 100 can be installed into the sled 10 with either a half-length riser 30A (FIG. 2C) or a full-length riser 30B (FIG. 2D) installed. The chassis 12 can include two areas to receive and couple with the crossbar 100. For example, the at least one pin 112 can be operable to be received in a corresponding pin opening 40 in the chassis 12 of the sled 10, and the plunger 114 can be operable to be received in a corresponding plunger opening 46 in the chassis 12 of the sled 10. The chassis 12 can have a first set of pin opening(s) 40A and plunger opening 46A and a second set of pin opening(s) 40B and plunger opening 46B. As illustrated in FIG. 2C, when the crossbar 100 is coupled with the chassis 12 so that the pin(s) 112 and the plunger 114 are received in the first set of pin opening(s) 40A and plunger opening 46A, a half-length riser 30A can be installed into the sled 10. As illustrated in FIG. 2D, when the crossbar 100 is coupled with the chassis 12 so that the pin(s) 112 and the plunger 114 are received in the second set of pin opening(s) 40B and plunger opening 46B, a full-length riser 30B can be installed into the sled 10. Accordingly, the single sled 10 and crossbar 100 can support both half-length risers 30A and full-length risers 30B.

In at least one example, the sled 10 can include a set of placeholders 50 to block the pin opening(s) 40 and plunger opening 46 which are not being utilized by the crossbar 100. Accordingly, air flow does not leak out of the pin opening(s) and plunger opening 46, and undesired dust and/or debris cannot pass into the sled 10. The placeholders 50 can include one or more pins 52 and a plunger 54 which function the same as with the crossbar 100.

In at least one example, the pin opening(s) 40 can include an L-shaped slot. The L-shaped slot of the pin openings 40 can include an entry slot 42 and a lock slot 44 connected to the entry slot 42. For example, the entry slot 42 can open vertically from the top of the chassis 12, and the lock slot 44 can open horizontally from a bottom end of the entry slot 42. Accordingly, the pin(s) 112 can be inserted into the entry slot 42, be moved vertically downwards, and then slide horizontally into the lock slot 44. Once inserted into the lock slot 44, the pin 112 cannot move vertically and/or has limited vertical movement. When the pin(s) 112 are slid sufficiently into the lock slot 44, the plunger 114 is aligned with the plunger opening 46. When aligned with the plunger opening 46, the shaft 1142 of the plunger 114 snaps outward and through the plunger opening 46. The shaft 1142 and the plunger 114 are then restricted in movement, which also restricts movement of the pin(s) 112 and correspondingly the frame 101 of the crossbar 100. Accordingly, the crossbar 100 is easily installed into the sled 10. Additionally, in at least one example, the crossbar 100 is configured to installed in one way and cannot be installed backwards. If the crossbar 100 is installed backwards, the plungers 114 would not fit correctly in the chassis 12 and the heat sink 116 would block the installation.

To remove the crossbar 100, the plunger heads 1140 are pulled inward to withdraw the shaft 1142 from the plunger opening 46. The crossbar 100 can then be slide horizontally so that the pins 112 slide in the lock slot 44 towards the entry slot 42. When the pins 112 are received in the entry slot 42, the crossbar 100 can be risen vertically out of the sled 10 to decouple the crossbar 100 from the chassis 12. Accordingly, the crossbar 100 can be easily and quickly removed and/or moved from the sled 10.

Figure 3A:
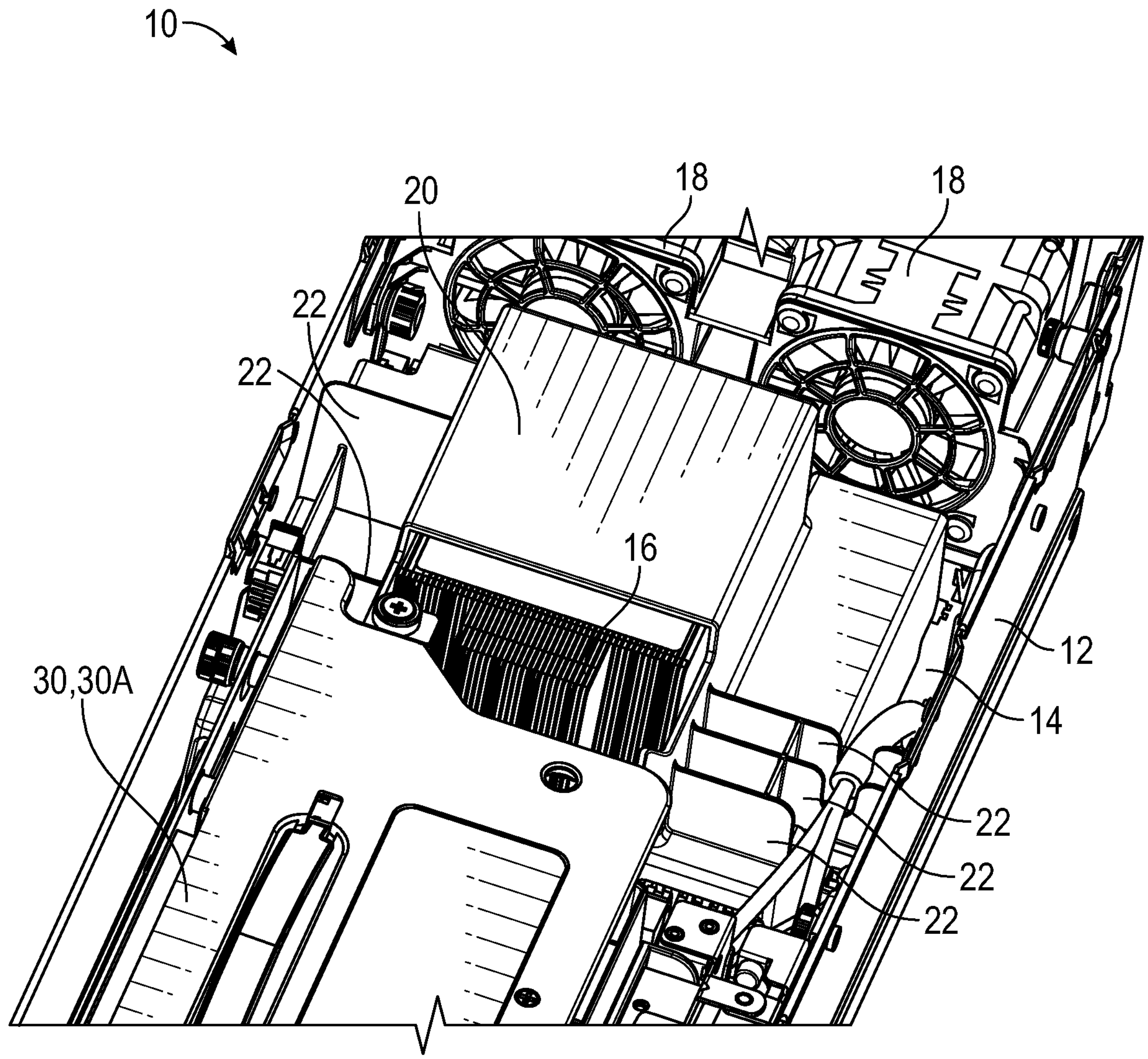
FIG. 3A is an enlarged view of a portion of a sled omitting the crossbar.
Figure 3B:
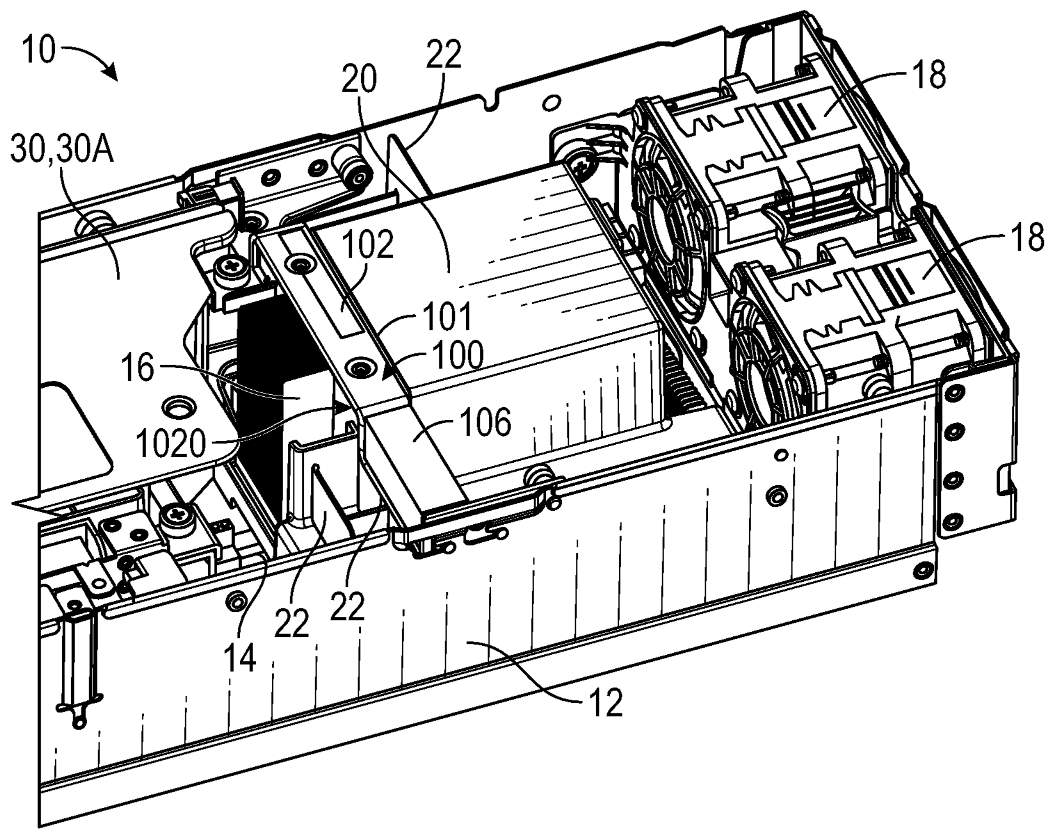
FIG. 3B is an enlarged view of a portion of the sled of FIG. 3A with the crossbar installed.
Figure 3C:
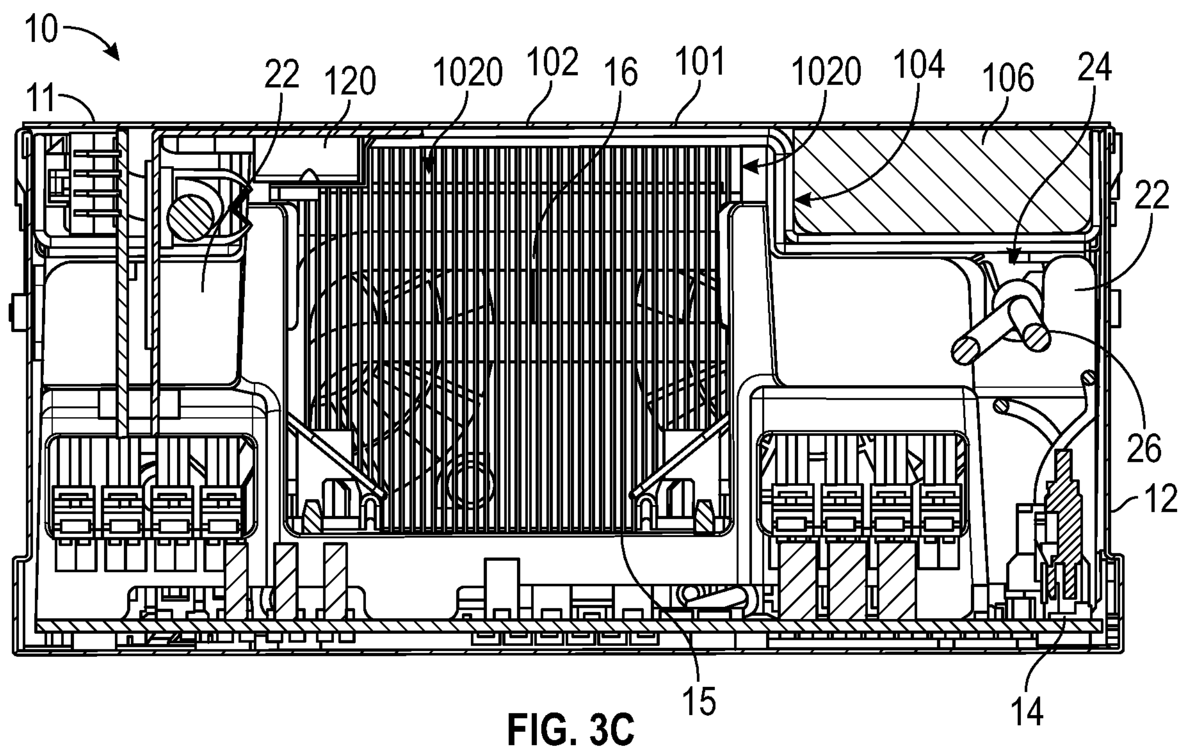
FIG. 3C is a cross-sectional view of the sled of FIG. 3B.

FIGS. 3A-3C illustrate how the crossbar 100 can assist in directing air flow within the sled 10. FIG. 3A illustrates the sled 10 omitting the crossbar 100. As can be seen in FIG. 3A, the sled 10 includes one or more baffles 22 operable to prevent air from passing therethrough to assist in directing the air flow through the heat sink 16. The baffles 22 can be disposed on either lateral side of the heat sink 16 and span from the heat sink 16 to the chassis 12. Accordingly, air flow to the fans 18 from opposite the heat sink 16 (e.g., from the riser 30) is blocked by the baffles 22 such that the only path for air is through the heat sink 16. In some examples, the baffles 22 may be positioned in series to help provide support as well as provide further resistance to air flow across the baffles 22.

FIGS. 3B and 3C illustrate the sled 10 with the crossbar 100 installed. The bottom surface 1012 of the frame 101 of the crossbar 100 are substantially aligned with the top edges of the baffles 22 and the heat sink 16. The frame 101 of the crossbar 100 aligns with the baffles 22 so that the crossbar 100 together with the baffles 22 block air flow across the sled 10. Additionally, the air dam 106 blocks air flow from passing above the crossbar 100. As illustrated in FIG. 3C, the chassis 12 can include a lid 11 operable to provide a top wall or surface to close the chassis 12. In at least one example, the lid 11 can be removable. In some examples, the lid 11 can be fixed in place. In at least one example, the air dam 106 is operable to abut against the lid 11 so that air flow across the air dam 106 and above the air dam 106 (e.g., between the air dam 106 and the lid 11) is prevented. For example, the air dam 106 can form a seal against the lid 11 to direct air flow, for example, through the CPU 15 and/or the heat sink 16. The air dam 106 sealed against the lid 11 is operable to prevent air flow from bypassing the CPU 15 and/or heat sink 16. In at least one example, as shown in FIGS. 3B and 3C, the air dam 106 is configured to be positioned above baffles 22. The keystone portion 102 of the frame 101 and the keystone air duct 1020 align with the heat sink 16 and/or the CPU 15 so that air can flow through the heat sink 16 and/or the CPU 15 towards the fans 18 without obstruction. Accordingly, the crossbar 100 (e.g., the frame 101 and/or the air dam 106), in conjunction with the baffles 22 and the lid 11, direct air into the desired flow area(s) (e.g., through the keystone air duct 1020 and/or the heat sink 16 and/or the CPU 15). The crossbar 100 assists in cooling down the sled 10 and managing the extreme temperatures experienced by NEBS.

In at least one example, at least one of the baffles 22 and/or the crossbar 100 form a cable management channel 24 operable to receive cables 26 disposed in the sled 10. As illustrated in FIG. 3C, the baffles 22 can form at least a portion of the cable management channel 24 as a passageway for the cables 26 to be received in and/or pass through. For example, the baffles 22 may form the cable management channel 24 as a cutout. As illustrated in FIG. 3C, the cutout has an open end. The crossbar 100 (e.g., the air dam 106 and frame 101) can be operable to close the open end of the cable management channel 24 so that there are no openings except for the area for the cables 26 to be received in. Accordingly, air is not able to flow across the baffles 22 and the crossbar 100 as the cables 26 block and/or reduce air flow across the cable management channel 24. In some examples, the frame 101 of the crossbar 100 may form the cable management channel 24 while the baffles 22 do not have a cut out such the baffles 22 close the open end of the cable management channel 24 formed in the crossbar 100. In some examples, the crossbar 100 and/or the baffles 22 may individually form a closed cable management channel 24 (e.g., form a closed hole).

Figure 4A:
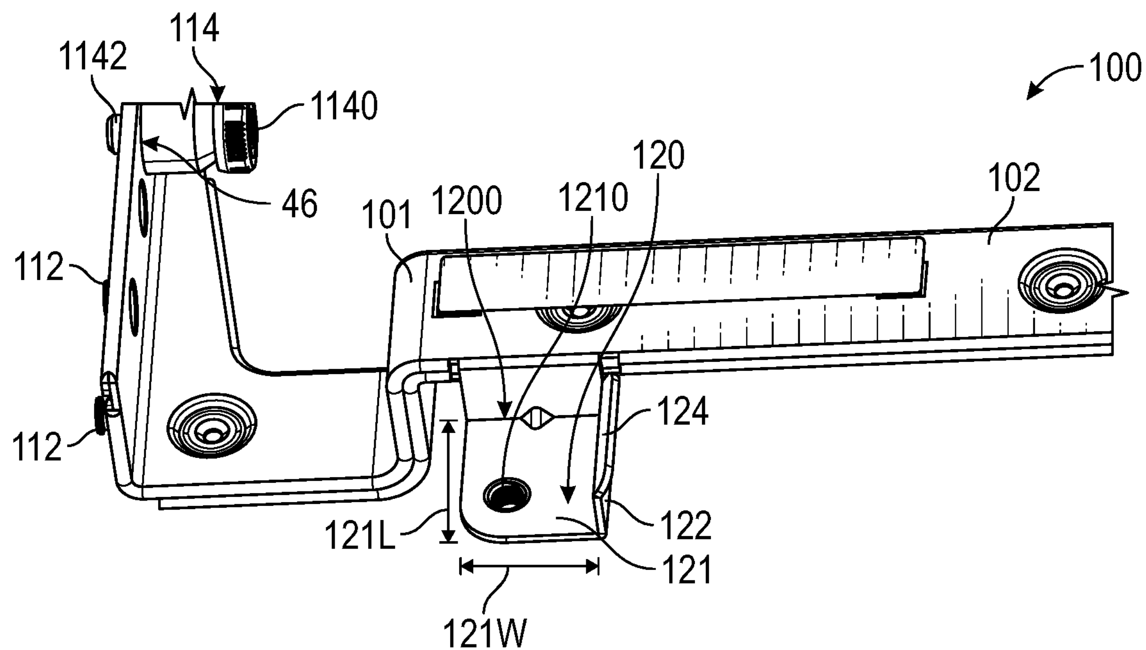
FIG. 4A is an enlarged view of a portion of the crossbar.
Figure 4B:
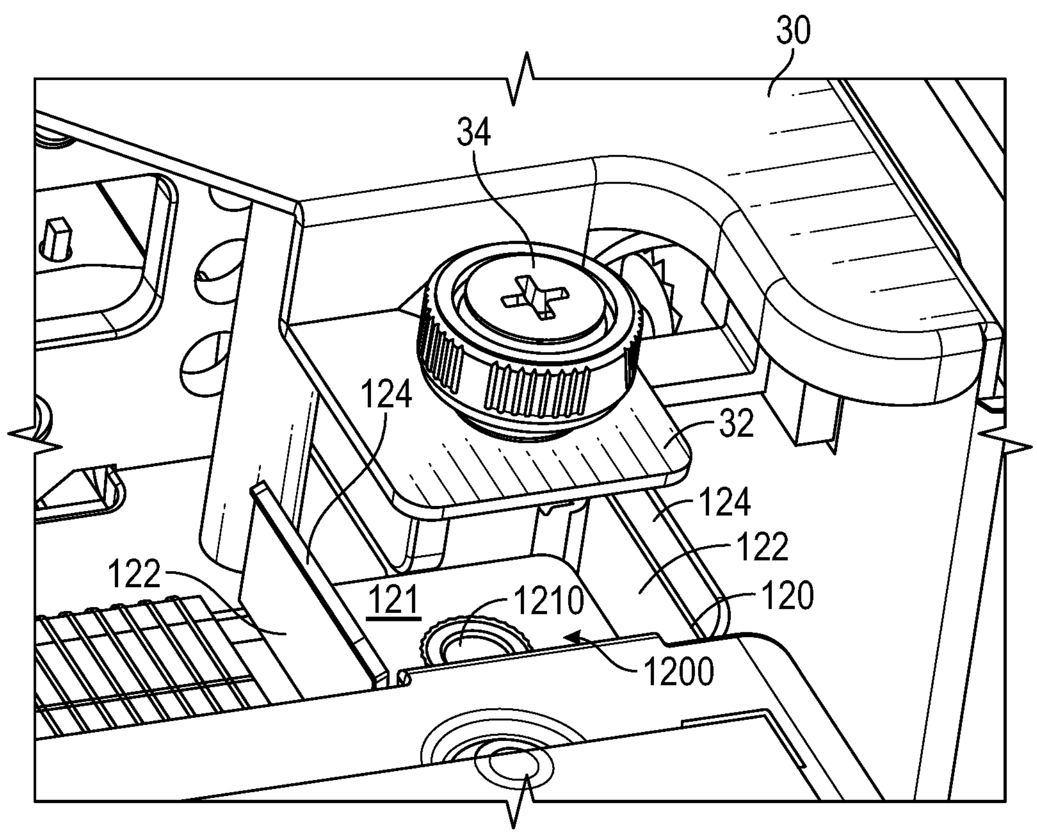
FIG. 4B is an enlarged view of a riser being installed into the sled and coupling with the crossbar.

FIGS. 4A and 4B illustrate the riser guide 120 of the crossbar 100 and installation of the riser 30. As discussed above, the riser guide 120 is operable to align a riser 30 to be plugged into the board 14 installed in the sled 10. In at least one example, the riser guide 120 can have a width 121W between about 0.5 centimeters and about 3 centimeters, alternately between about 1 centimeter and about 2 centimeters, alternately about 1.46 centimeters. The riser guide 120 can have a length 121L between about 1 centimeter and about 4 centimeters, alternately between about 1 centimeter and about 3 centimeters, alternately between about 1.2 centimeter and about 2 centimeters, alternately about 1.72 centimeters.

In the example illustrated in FIGS. 4A and 4B, receiving portion 1200 of the riser guide 120 is operable to receive a guiding portion 32 of the riser 30. This guides the alignment and ensures the positioning of the riser 30 as the riser 30 is installed into the board 14. In at least one example, the guiding portion 32 of the riser 30 can be a rear end of the riser 30. The guiding portion 32 is inserted into the receiving portion 1200 of the riser guide 120. The guide side(s) 122 and/or the guide portion 124 of the riser guide 120 help ensure correct alignment and insertion of the guiding portion 32 of the riser 30 into the receiving portion 1200. The riser 30 can then be installed straight down into the board 14. Ensuring correct alignment and positioning of the riser 30 during installation can prevent damage to the riser 30 and/or the board 14.

When the guiding portion 32 is received in the receiving portion 1200, in at least one example, the riser guide 120 is operable to couple with the riser 30 to prevent undesired movement of the riser 30 which can damage the riser 30 and/or the board 14. This further provides structural support for the sled 10. In at least one example, as illustrated in FIGS. 4A and 4B, the riser guide 120 can be operable to be coupled with the riser 30 by threaded engagement. The coupling component 1210 may include a threaded insert, and the guiding portion 32 can include a corresponding riser coupling component 34 such as a screw. In at least one example, the riser coupling component 34 can include a thumb screw. The riser coupling component 34 can be inserted into the coupling component 1210 to securely couple the riser 30 with the riser guide 120 and the crossbar 100. Other coupling mechanisms to couple the riser guide 120 and the riser 30 may be utilized without deviating from the scope of the present disclosure.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure to the full extent indicated by the broad general meaning of the terms used in the attached claims. It will therefore be appreciated that the embodiments described above may be modified within the scope of the appended claims.

What is claimed is:

1. A method comprising:

providing a crossbar in a sled for a computing system such that the crossbar is coupled with a chassis of the sled;

aligning a riser, with a rise guide extending from a frame of the crossbar, to be plugged into a board installed in the sled; and directing air flow, by the crossbar, to flow through the frame of the crossbar towards a computing component.

2. The method of claim 1, wherein the crossbar is removably installed in the sled.

3. The method of claim 1, wherein the frame includes a keystone portion forming a keystone air duct, wherein the keystone air duct is operable to direct the air flow through the keystone air duct towards the computing component.

4. The method of claim 1, wherein the computing component includes a heat sink and/or a processing unit.

5. The method of claim 1, wherein the frame includes two lateral sides, wherein each of the two lateral sides includes at least one pin and a fastener, wherein providing the crossbar in the sled includes:

receiving the at least one pin in a corresponding pin opening in the chassis of the sled;

receiving the fastener in a corresponding plunger opening in the chassis of the sled.

6. The method of claim 1, further comprising:

closing a lid of the sled to close the chassis such that the lid abuts against the crossbar to prevent air flow across the crossbar between the crossbar and the lid.

7. A method comprising:

separating a riser from a riser guide extending from a frame of a crossbar;

decoupling the crossbar from a chassis of a sled;

servicing the sled;

installing the crossbar in the sled such that the crossbar is coupled with the chassis of the sled; and aligning the riser, with the riser guide, to be plugged into a board installed in the sled.

8. The method of claim 7, wherein the frame of the crossbar includes a keystone air duct, the method further comprising:

directing, by the keystone air duct, air flow through the keystone air duct towards a computing component installed in the sled.

9. The method of claim 7, wherein the separating the riser from the riser guide includes:

decoupling the riser guide with the riser.

10. The method of claim 7, wherein the frame includes two lateral sides, wherein each of the two lateral sides includes at least one pin and a fastener, wherein decoupling the crossbar from the chassis of the sled includes:

removing the at least one pin from a corresponding pin opening in the chassis of the sled;

removing the fastener from a corresponding plunger opening in the chassis of the sled.

11. The method of claim 7, further comprising:

plugging the riser into the board.

12. The method of claim 11, further comprising:

coupling the riser guide with the riser.

13. The method of claim 12, wherein the riser guide is coupled with the riser by threaded engagement.

14. A system comprising:

a server;

one or more sleds operable to be received in the server, the one or more sleds including a chassis, the chassis operable to receive a board, a computing component, and a riser; and a crossbar operable to be removably installed in the one or more sleds, the crossbar including:

a frame operable to direct air flow through the frame towards the computing component; and a riser guide extending from the frame, the riser guide operable to align the riser to be plugged into the board installed in the one or more sleds.

15. The system of claim 14, wherein the frame includes a keystone portion forming a keystone air duct, wherein the keystone air duct is operable to direct the air flow through the keystone air duct towards the computing component.

16. The system of claim 14, wherein the frame includes two lateral sides, wherein each of the two lateral sides includes at least one pin and a fastener, wherein each of the two lateral sides includes at least one pin and a fastener, the at least one pin and the fastener operable to couple the frame to the one or more sleds.

17. The system of claim 14, wherein the riser guide is operable to be coupled with the riser.

18. The system of claim 14, wherein the one or more sleds includes a lid operable to be positioned on the chassis such that the lid abuts against the crossbar to prevent air flow across the crossbar between the crossbar and the lid.

19. The system of claim 14, wherein the one or more sleds further includes one or more baffles operable to prevent air from passing therethrough to assist in directing the air flow through the frame and the computing component.

20. The system of claim 19, wherein at least one of the one or more baffles and the crossbar together forms a cable management channel operable to receive cables disposed in the one or more sleds.

* * * * *